United States Patent [19]

Ogiue

[11] 3,893,155

[45] July 1, 1975

[54] COMPLEMENTARY MIS INTEGRATED CIRCUIT DEVICE ON INSULATING SUBSTRATE

[75] Inventor: Katsumi Ogiue, Tokyo, Japan

[73] Assignee: Hitachi, Ltd., Japan

[22] Filed: June 17, 1974

[21] Appl. No.: 480,293

[30] Foreign Application Priority Data

Oct. 12, 1973 Japan ............................ 48-113886

[52] U.S. Cl. ....................... 357/42; 357/4; 357/23; 357/41; 357/49

[51] Int. Cl. ............................................ H01l 11/14

[58] Field of Search .......................... 357/23, 41, 42

[56] References Cited

UNITED STATES PATENTS

| | | | |
|---|---|---|---|
| 3,412,297 | 11/1968 | Amlinger | 357/23 |
| 3,493,812 | 2/1970 | Weimer | 357/42 |
| 3,518,509 | 6/1970 | Cullis | 357/42 |
| 3,745,072 | 7/1973 | Scott | 357/42 |
| 3,749,614 | 7/1973 | Boleky et al. | 357/42 |

OTHER PUBLICATIONS

F. Hochberg et al., "Fabrication of MOS Devices with Close Source-Drain Spacing," IBM Tech. Disclosure Bull., Vol. 10, (10/67), pp. 653–4.

T. J. Rodgers et al., "VMOS: High Speed TTL Compatible MOS Logic," IEEE J. of Solid State Circuits SC–9, (10/74), pp. 239–250.

*Primary Examiner*—Martin H. Edlow
*Assistant Examiner*—Gene M. Munson
*Attorney, Agent, or Firm*—Craig & Antonelli

[57] ABSTRACT

A complementary MIS integrated circuit device comprises an insulating substrate which can precipitate a simple substance material, a monocrystal silicon layer which is formed on the insulating substrate, semiconductor regions which are formed on two sides within the silicon layer and which constitute longitudinal type p-channel and n-channel MISFETs on the respective sides, a notch which is formed between the semiconductor regions on both sides and which extends down to the insulating substrate, gate insulating films which are formed on the side surfaces of the notch, and a gate electrode which is formed on the gate insulating films and the exposed part of the insulating substrate and which is common to both the MISFETs, whereby a p-channel MISFET and a n-channel MISFET are formed to provide a complementary circuit.

25 Claims, 11 Drawing Figures

COMPLEMENTARY MIS INTEGRATED CIRCUIT DEVICE ON INSULATING SUBSTRATE

BACKGROUND OF THE INVENTION

1. Field of the Invention

The present invention relates to a complementary MIS integrated circuit device.

2. Description of the Prior Art

The structure of a complementary MIS integrated circuit has hitherto been that described in U.S. Pat. No. 3,356,858 and shown in FIG. 3 of the accompanying drawings. A $p^-$ -type layer 12 is formed at a portion of an n-type semiconductor substrate 11 by a diffusion process, and $n^+$ -type layers 13 and 14 are formed within the region of the $p^-$ -type layer 12 by diffusion, so that an n-channel MISFET $M_2$ is constructed. On the other hand, $p^+$ -type layers 15 and 16 are formed directly in another portion of the n-type semiconductor substrate 11 by diffusion, so that a p-channel MISFET $M_1$ is constructed.

Since, with the complementary MIS integrated circuit device of this structure, the length of each channel is governed by the precision of photoetching during the diffusion step, a complementary MIS integrated circuit of high operating speed cannot be obtained. Moreover, since the two gate electrodes must be formed on the semiconductor substrate, the area occupied by the complementary MIS integrated circuit device is large.

Because of these deficiencies applicant developed a complementary MIS integrated circuit device having dephased self-alignment structure having high integration density to shorten the channels without changing the characteristics. This complementary MIS integrated circuit device is disclosed in Japanese applications 49,721 and 49,722 filed in 1973 and is shown in FIG. 4. It comprises an n-type region 18 formed on a p-type semiconductor substrate 17, a p-type region 19 formed in a portion of the surface layer portion of the n-type region 18, an insulated gate 20 formed so as to penetrate the n-type region 18 as well as the p-type region 19 and to reach the semiconductor substrate 17, and an n-type region 21 formed in a portion of the p-type region 19 and contacting a side portion of the gate, so as to form a p-channel MISFET $M_1$ on one side of the gate and an n-channel MISFET $M_2$ on the other side.

With this structure, however, the p-n junction is utilized for electrical isolation between the p-channel MISFET $M_1$ and the n-channel MISFET $M_2$. For this reason, when the semiconductor substrate is grounded as illustrated by way of example in the figure, the supply voltage must be positive. An input signal $V_{in}$ and an output signal $V_{out}$ consequently become in phase in such manner that when the input $V_{in}$ is at a high level, the n-channel MISFET $M_2$ becomes conductive to render the output $V_{out}$ at a high level. When the input $V_{in}$ is at a low level, the p-channel MISFET $M_1$ becomes conductive to render the output $V_{out}$ at a low level. In general, a logical circuit utilizes an inverter circuit in which the input signal $V_{in}$ and the output signal $V_{out}$ are 180° out of phase. Therefore, the complementary MIS integrated circuit device in FIG. 4 has the disadvantage that the range of use is narrow.

SUMMARY OF THE INVENTION

The present invention has been made in order to solve the problem stated above, and has as its object the provision of a complementary MIS Integrated circuit device of dephased self-alignment structure in which a voltage may be applied as desired.

The fundamental construction of the present invention for accomplishing the object is characterized by a monocrystal silicon layer which is formed on an insulating substrate capable of precipitating a simple substance material, semiconductor layers which are formed on two sides within the silicon layer and which constitute longitudinal p-channel and n-channel MISFETs on the respective sides, two side surfaces which are formed between the semiconductor layers on both sides and which reach the insulating substrate, gate insulating films which are formed on both side surfaces, and a common gate electrode which is formed on the gate insulating films, whereby a complementary circuit is made up of a p-channel MISFET and an n-channel MISFET.

BRIEF DESCRIPTION OF THE DRAWINGS

FIG. 3 is a sectional view of a prior-art complementary MIS integrated circuit device, the figure having been already referred to; and FIG. 4 is a sectional view of a complementary MIS Integrated circuit device which has been previously proposed by the inventor, the figure having been already referred to.

PREFERRED EMBODIMENTS OF THE INVENTION

The present invention will now be concretely described with reference to the drawings.

FIGS. 1*a* to 1*h* show sectional views for explaining the manufacturing process of a complementary MIS integrated circuit device embodying the present invention.

Figure 1A:
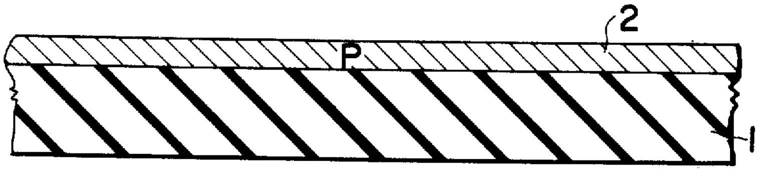
FIGS. 1*a* to 1*h* are sectional views for explaining the method of manufacturing an embodiment of the complementay MIS integrated circuit device according to the present invention.

As illustrated in FIG. 1*a* on a substrate 1 of an insulator which is a crystal having a similar crystal lattice capable of epitaxially growing a semiconductor monocrystalline material thereon, for example, of sapphire, a p-type semiconductor layer monocrystal 2 is epitaxially grown.

Figure 1B:
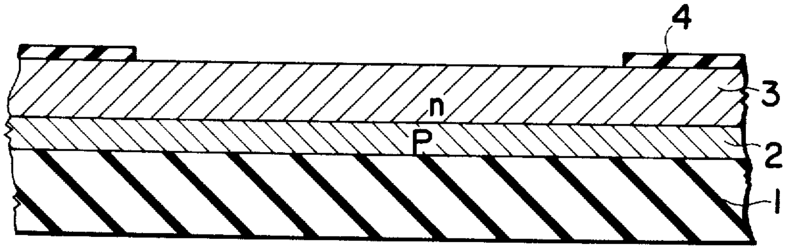

Then, as shown in FIG. 1*b*, on the p-type semiconductor layer 2, an n-type semiconductor layer 3 is epitaxially grown, and an $SiO_2$ film 4 is formed on a selected area of the semiconductor layer 3.

Figure 1C:
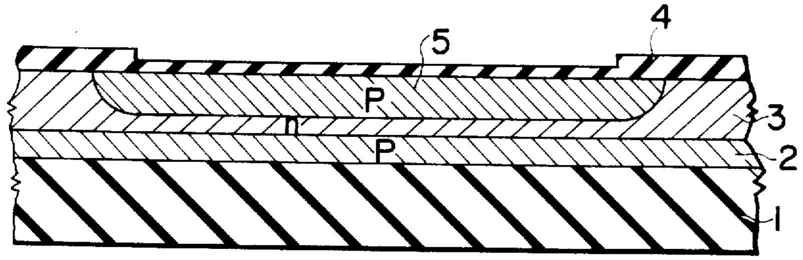

Next, as shown in FIG. 1*c*, using the $SiO_2$ film 4 as a mask, a p-type region 5 is selectively diffused, with oxide film 4 thickening and being formed on the diffused region 5.

Figure 1D:
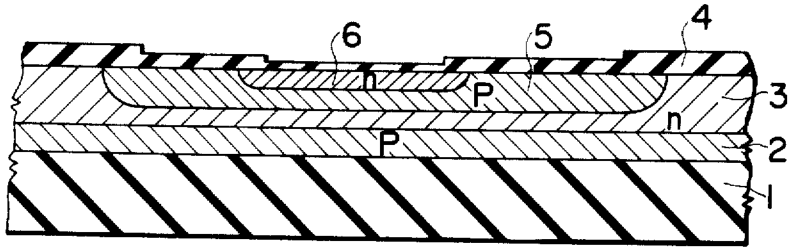

Then, in the surface of the p-type region 5, an n-type region 6 is diffused, as shown in FIG. 1*d*.

Figure 1E:
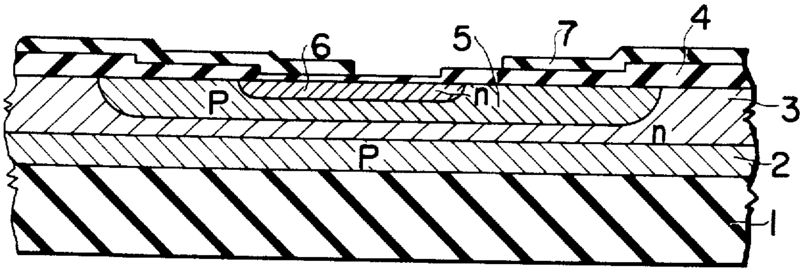

Next, on a selected area of the surface of the resultant substrate, a photoresist film 7 is formed as illustrated in FIG. 1*e*.

Figure 1F:
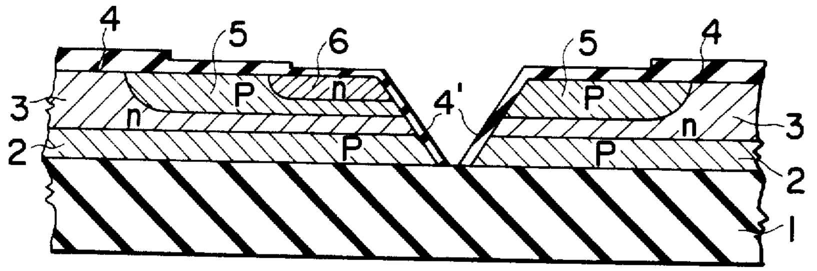

Then, as shown in FIG. 1*f*, using the photoresist film 7 as a mask, a part of the resultant structure is etched with an HF-series etchant (e.g. a mixed solution consisting essentially of fluoric acid (HF), nitric acid ($HNO_3$) and acetic acid ($CH_3COOH$)) into the shape of the letter V so as to penetrate through the semiconductor layers and reach the insulating substrate 1. Thus, the n-type semiconductor region 6, the p-type semiconductor region 5, the n-type semiconductor layer 3 and the p-type semiconductor layer 2 are exposed to one side etching surface, while the p-type semiconductor region 5, the n-type semiconductor region 3 and the p-type semiconductor layer 2 are exposed to the other side etching surface. $SiO_2$ films 4' to become gate insulating films are then formed on the etching surfaces.

Figure 1G:
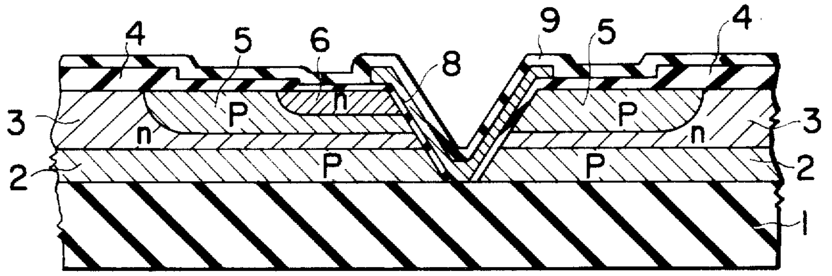

Thereafter, as shown in FIG. 1*g*, on selected areas of the $SiO_2$ films 4', a layer 8 of, for example, polycrystalline silicon which is to become a gate electrode is formed by CVD (chemical vapor deposition) techniques, such as by thermal oxidation of monosilane $SiH_4$. Further, a CVD $SiO_2$ film 9 is formed on the entire surface of the resultant substrate.

Figure 1H:
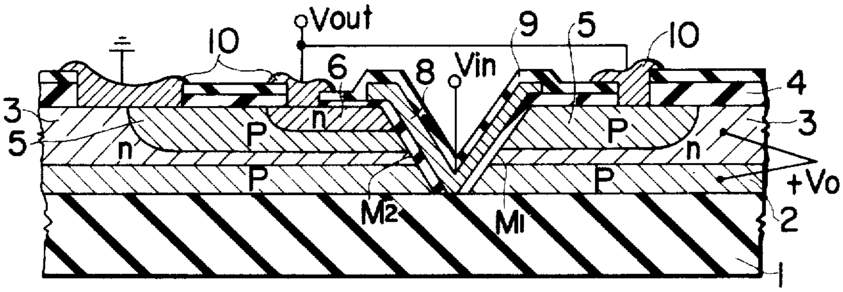

Thereafter, electrode openings are formed, and electrodes 10 are provided as shown in FIG. 1*h*.

In the semiconductor device thus constructed, a p-channel MISFET $M_1$ and an n-channel MISFET $M_2$ are defined by the boundary of the etched surfaces. The gate electrodes of these MISFETs are integrally formed of the polysilicon layer 8, and have an input signal $V_{in}$ applied thereto. The p-type semiconductor region 5 to become the drain of the MISFET $M_1$ and the n-type semiconductor region 6 to become the drain of the MISFET $M_2$ are connected by wiring, and lead to an output terminal $V_{out}$. The p-type semiconductor layer 2 to become the source of the MISFET $M_1$ and the n-type semiconductor region 3 to become the channel region are connected, and have a supply voltage $+V_o$ applied thereto. On the other hand, the n-type semiconductor region 3 to become the source of the MISFET $M_2$ and the p-type semiconductor region 5 to become the channel region are connected by the electrode 10, and are grounded.

With the semiconductor integrated circuit device of the above construction, when the input signal $V_{in}$ is at a high level, the n-channel MISFET $M_2$ turns "on" and the output signal $V_{out}$ falls into a low level, while when the input signal $V_{in}$ is at the low level, the p-channel MISFET $M_1$ turns "on" and the output signal $V_{out}$ becomes the high level. Accordingly, the input signal $V_{in}$ and the output signal $V_{out}$ are opposite in phase, and an inverter circuit of the complementary type can be constructed.

Since, according to the present invention, the p-channel MISFET and the n-channel MISFET are of the dephased self-alignment structure, the channel lengths of the respective MISFETs can be reduced to about one-fifth in comparison with those of the prior-art MISFETs irrespective of the precision of forming the photoresist. For this reason, the MISFETs of the present invention have the property of high speed operation.

Due to the dephased self-alignment structure, the junction capacitances in the drain regions of the MISFETs can be made low. This also contributes to the property of high speed MISFETs.

The gate electrodes of the p-channel MISFET and the n-channel MISFET are integrally formed, so that the integration density can be increased.

The present invention is not restricted to the foregoing embodiment, but it can adopt various aspects of performance.

Figure 2:
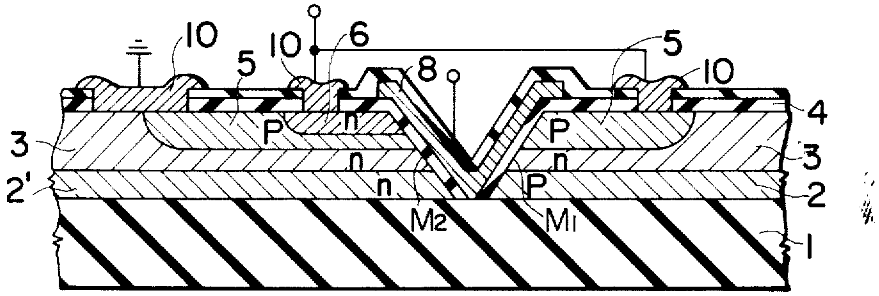
FIG. 2 is a sectional view showing another embodiment of the present invention.
Figure 3:
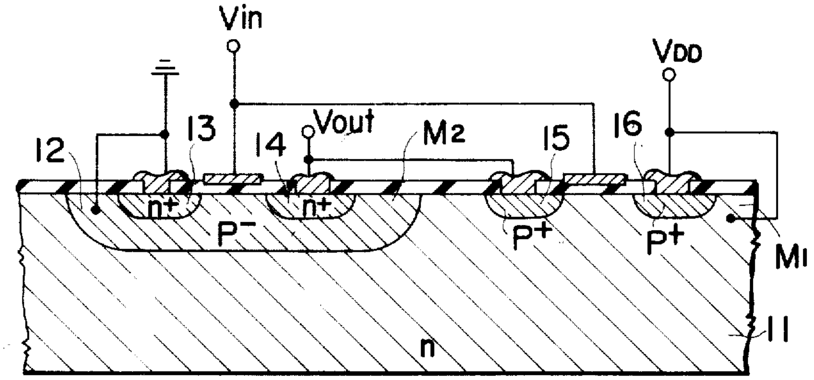
FIG. 3 PRIOR ART
Figure 4:
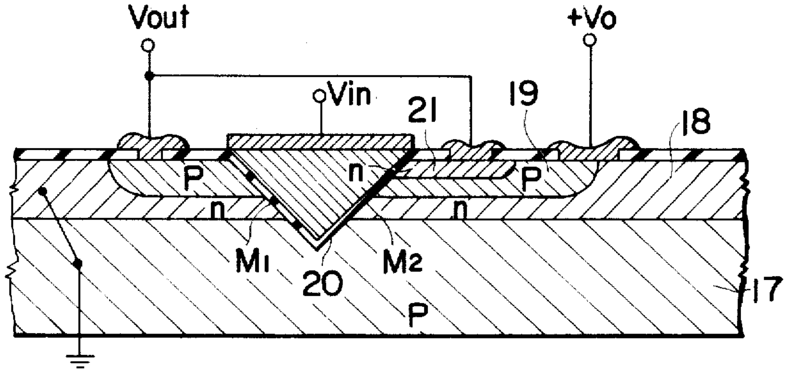

For example, as is shown in FIG. 2, in the semiconductor layers on the insulating substrate 1 on the side of the n-channel MISFET $M_2$, an n-type impurity may be diffused into the p-type semiconductor layer 2 formed by epitaxial growth, so as to convert the layer to n-type. With this measure, the conductivity of the source of the n-channel MISFET $M_2$ is improved, and the output impedance can be made low.

Also, a p-type semiconductor layer is thickly formed on the insulating substrate 1, and within such p-type semiconductor layer, p-n and n-p-n layers of the longitudinal type are formed by diffusion, as illustrated in FIG. 2.

Although the foregoing embodiment etches the gate part into the shape of the letter V, the shape is not restrictive but may of course be of the letter U. Although the common gate electrode is made of polysilicon, other conductors such as Al, Au, Ag, etc. may of course be employed.

It is needless to say that even when the conductivity types of the semiconductor layers and the semiconductor regions in the embodiments of the present invention are opposite one another, the same effects are achieved.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What I claim:

1. A semiconductor device comprising:

an insulating substrate;

a first semiconductor layer of one of a first conductivity type and a second conductivity type disposed on a first portion of said substrate;

a second semiconductor layer of said first conductivity type disposed on a second portion of said substrate spaced apart from said first portion of said substrate, the side surface of said second semiconductor layer facing the opposite side surface of said first semiconductor layer;

a third semiconductor layer of a second conductivity type, opposite said first conductivity type, disposed on said first semiconductor layer and having a side surface contiguous with the side surface of said first semiconductor layer;

a fourth semiconductor layer of said second conductivity type disposed on said second semiconductor layer and having its side surface contiguous with the side surface of said second semiconductor layer;

a fifth semiconductor layer of said first conductivity type disposed on said third semiconductor layer and having its side surface contiguous with the side surface of said third semiconductor layer;

a sixth semiconductor layer of said first conductivity type disposed on said fourth semiconductor layer and having its side surface contiguous with the side surface of said fourth semiconductor layer;

a seventh semiconductor layer of said second conductivity type disposed on said fifth semiconductor layer and having its side surface contiguous with the side surface of said fifth semiconductor layer;

a first insulating film formed along the side surfaces of said first, third, fifth and seventh semiconductor layers;

a second insulating film formed along the side surfaces of said second, fourth, and sixth semiconductor layers; and a layer of electrode material formed on each of said first and second insulating films.

2. A semiconductor device according to claim 1, wherein said sixth and seventh semiconductor layers are electrically connected to each other.

3. A semiconductor device according to claim 2, wherein said third and fifth semiconductor layers are electrically connected together.

4. A semiconductor device according to claim 3, wherein said second and fourth semiconductor layers are electrically connected together.

5. A semiconductor device according to claim 4, wherein said electrically connected second and fourth layers and said electrically connected third and fifth layers are connected to respectively different sources of reference potential.

6. A semiconductor device according to claim 1, wherein said first semiconductor layer is of said first conductivity type.

7. A semiconductor device according to claim 1, wherein said first semiconductor layer is of said second conductivity type.

8. A semiconductor device according to claim 1, wherein said layer of electrode material is a layer of semiconductor material.

9. A complementary MISFET integrated circuit device comprising:

a monocrystal silicon layer formed on an insulating substrate capable of precipitating a simple substance material;

semiconductor layers which are formed on two sides within said silicon layer and which constitute a p-channel MISFET and an n-channel MISFET of the longitudinal type on respective ones of said two sides, said two side surfaces being formed between said semiconductor layers on both sides and which reach said insulating substrate;

gate insulating films which are formed on said side surfaces; and a common gate electrode which is formed on said gate insulating films;

whereby a complementary circuit is made up of said p-channel MISFET and said n-channel MISFET.

10. A semiconductor device comprising:

a substrate of insulating material;

a first plurality of semiconductor layers disposed one on top of another on a first portion of said insulating substrate, at least three adjacent ones of which have respectively different conductivity types;

a second plurality of semiconductor layers disposed one on top of another on a second portion of said insulating substrate, and at least three adjacent ones of which have respectively different conductivity types, said second plurality of layers being spaced apart from said first plurality of layers and having side surfaces thereof facing side surfaces of said first plurality of layers;

first and second insulating films disposed on the respective side surfaces of said first and second pluralities of semiconductor layers; and a common electrode layer disposed on said first and second insulating films.

11. A semiconductor device according to claim 10, wherein said at least three adjacent layers of said first plurality of semiconductor layers have N, P, and N conductivity types respectively, while said at least three adjacent layers of said second plurality of semiconductivity layers have P, N, and P conductivity types, respectively.

12. A semiconductor device according to claim 10, wherein a selected one of said first plurality of semiconductor layers is connected to a selected one of said second plurality of semiconductor layers.

13. A semiconductor device according to claim 10, wherein two adjacent layers of said at least three adjacent layers of said first plurality are electrically connected together.

14. A semiconductor device according to claim 13, wherein two adjacent layers of said at least three adjacent layers of said second plurality are electrically connected together.

15. A semiconductor device according to claim 14, wherein said two adjacent layers of said first plurality are connected to a first source of reference potential, while said two adjacent layers of said second plurality are connected to a second source of reference potential different from said first source.

16. A semiconductor device according to claim 10, wherein two adjacent layers of said at least three adjacent layers of said second plurality are electrically connected together.

17. A semiconductor device according to claim 10, wherein said first plurality of semiconductor layers further includes a fourth semiconductor layer of a conductivity type opposite to the conductivity type of that layer of said at least three layers to which it is adjacent.

18. A semiconductor device according to claim 10, wherein said first plurality of said semiconductor layers further includes a fourth semiconductor layer of a conductivity type the same as the conductivity type of that layer of said at least three layers to which it is adjacent.

19. A semiconductor device comprising:

a substrate of insulating material;

a first semiconductor layer at least a portion of which is of a first conductivity type formed on said substrate;

a second semiconductor layer of a second conductivity type, opposite said first conductivity type, formed on said first semiconductor layer and defining a first PN junction with said at least a portion thereof;

a first semiconductor region of said first conductivity type disposed in said second semiconductor layer and defining a second PN junction therewith;

a second semiconductor region of said second conductivity type disposed in said first semiconductor region and defining a third PN junction therewith;

a groove extending through said regions and said layers to the surface of said substrate, so as to separate said regions and layers into first and second separate portions, side surfaces of which are defined by said groove, with each of said first, second and third PN junctions terminating at said side surfaces of said groove, said first portion containing each of said layers and regions and said second portion containing only said first and second layers and said first region;

first and second insulating films disposed on the side surfaces of said groove at which said PN junctions terminate; and a common electrode layer formed on each of said first and second insulating films.

20. A semiconductor device according to claim 19, wherein said second semiconductor region of said first portion is electrically connected to said first semiconductor region in said second portion.

21. A semiconductor device according to claim 20, wherein said second semiconductor layer is electrically connected to said first semiconductor region in said first portion and to said first semiconductor layer in said second portion.

22. A semiconductor device according to claim 22, wherein said second semiconductor layer is connected to a first source of reference potential in said first portion and to a second source of reference potential, different from said first source of reference potential, in said second portion.

23. A semiconductor device according to claim 19, wherein said second semiconductor layer is electrically connected to said first semiconductor region in said first portion and to said first semiconductor layer in said second portion.

24. A semiconductor device according to claim 19, wherein the first portion of said first semiconductor layer is of said second conductivity type.

25. A semiconductor device according to claim 19, wherein the entirety of said first semiconductor layer is of said first conductivity type.

* * * * *